(12) United States Patent
Smith

(10) Patent No.: US 6,496,688 B2
(45) Date of Patent: *Dec. 17, 2002

(54) HEAVY-DUTY AUDIO EQUIPMENT

(75) Inventor: Roger Q. Smith, Reisterstown, MD (US)

(73) Assignee: Black & Decker Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/140,449

(22) Filed: May 6, 2002

(65) Prior Publication Data

US 2002/0158604 A1 Oct. 31, 2002

Related U.S. Application Data

(63) Continuation of application No. 09/262,751, filed on Mar. 4, 1999, now Pat. No. 6,427,070.

(51) Int. Cl.[7] .............................. H04B 1/16; H04B 1/06; H04B 1/08; H05K 11/00
(52) U.S. Cl. ....................... 455/343; 455/344; 455/347; 320/112; 320/113
(58) Field of Search ................................. 455/343, 344, 455/347, 89, 351, 572, 573, 90; 361/814; D14/156, 162, 163, 164, 168, 170, 172, 193, 194, 196, 197, 198; 429/7; 320/110, 112, 113, 125, 160, 132, 134, 150

(56) References Cited

U.S. PATENT DOCUMENTS

| | | | | | |
|---|---|---|---|---|---|
| 5,404,419 | A | * | 4/1995 | Artis, Jr. ...................... | 34/239 |
| 5,633,096 | A | * | 5/1997 | Hattori ........................ | 429/100 |
| 5,810,168 | A | * | 9/1998 | Eggering .................... | 206/372 |
| 5,889,383 | A | * | 3/1999 | Teich .......................... | 320/107 |
| D418,836 | S | * | 1/2000 | Matt et al. ................. | D14/196 |
| 6,127,797 | A | * | 10/2000 | Walker ....................... | 320/101 |
| 6,154,008 | A | * | 11/2000 | Bradus et al. .............. | 320/125 |
| 6,215,276 | B1 | * | 4/2001 | Smith .......................... | 320/111 |
| 6,230,029 | B1 | * | 5/2001 | Hahn et al. ................. | 379/430 |
| 6,427,070 | B1 | * | 7/2002 | Smith .......................... | 320/112 |

* cited by examiner

*Primary Examiner*—Nay Maung
*Assistant Examiner*—Ray Persino
(74) *Attorney, Agent, or Firm*—Adan Ayala

(57) ABSTRACT

In accordance with the present invention, an improved audio equipment is employed. The audio equipment includes a housing, audio circuitry installed within the housing, and a first protective bar flexibly connected to the housing. The audio equipment may also include a handle attached to the first protective bar, a second protective bar flexibly connected to the housing, and/or a connector assembly flexibly connecting the first protective bar to the housing. The connector assembly may include a flexible gasket preferably disposed between the first protective bar and the housing. Also disclosed herein is a method for manufacturing an audio equipment.

12 Claims, 3 Drawing Sheets

HEAVY-DUTY AUDIO EQUIPMENT

This is a continuation of application Ser. No. 09/262,751, filed Mar. 4, 1999, now U.S. Pat. No. 6,427,070.

FIELD OF THE INVENTION

This invention relates generally to audio equipment and, more particularly, to heavy-duty radios.

BACKGROUND OF THE INVENTION

It is well known that audio equipment, such as portable radios, are taken to construction sites, so that the construction workers can listen to music, talk shows, etc., while working. However, the audio equipment may be destroyed at the jobsite because tools may be dropped on them. Similarly, the equipment may fall from a table, etc., resulting in damage thereto.

It is therefore an object of this invention to provide an audio equipment that can withstand the rigors of a jobsite.

Furthermore, because construction workers have different cordless power tools, it would be beneficial if the audio equipment would receive the rechargeable battery packs used with the power tools in order to charge the battery packs and/or power the audio equipment.

SUMMARY OF THE INVENTION

In accordance with the present invention, an improved audio equipment is employed. The audio equipment includes a housing, audio circuitry installed within the housing, and at least one protective covering, shell or bar flexibly connected to the housing. Preferably, a handle may be attached to the protective covering.

Further disclosed is a method for charging a battery pack comprising the steps of providing an audio equipment component having a power supply, a radio circuit connected to the power supply and a charger connected to the power supply, disposing the battery pack in the charger, providing power to the battery pack for recharging, and removing the battery pack from the charger. The battery pack can then be inserted into a power tool.

Additional features and benefits of the present invention are described, and will be apparent from, the accompanying drawings and the detailed description below.

BRIEF DESCRIPTION OF THE DRAWINGS

The accompanying drawings illustrate preferred embodiments of the invention according to the practical application of the principles thereof, and in which.

DETAILED DESCRIPTION

Figure 1:
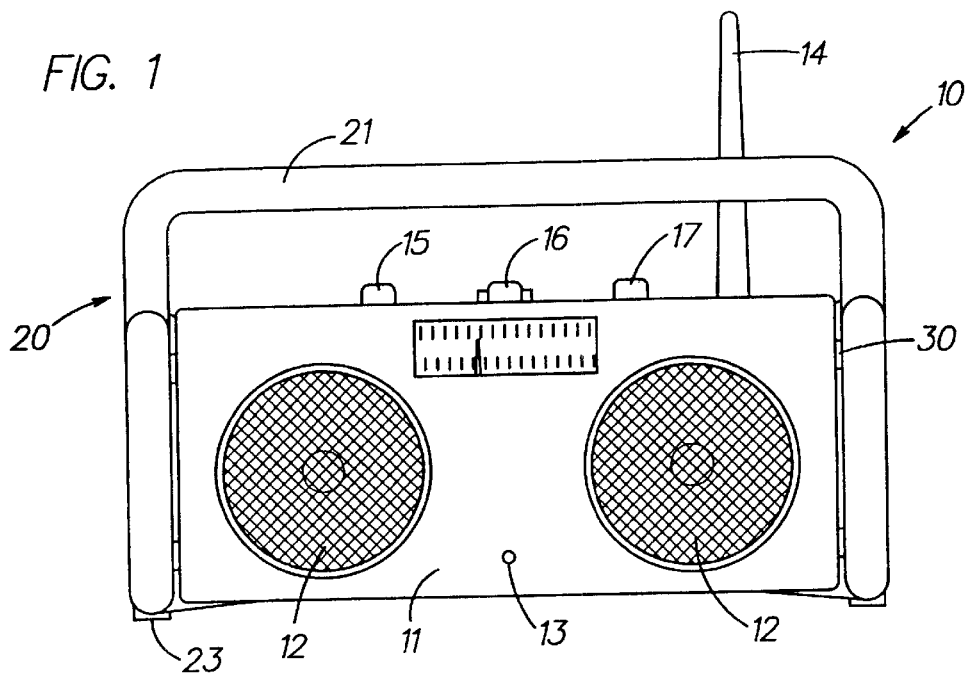
FIG. 1 is a front elevational of an audio equipment according to the present invention.
Figure 2:
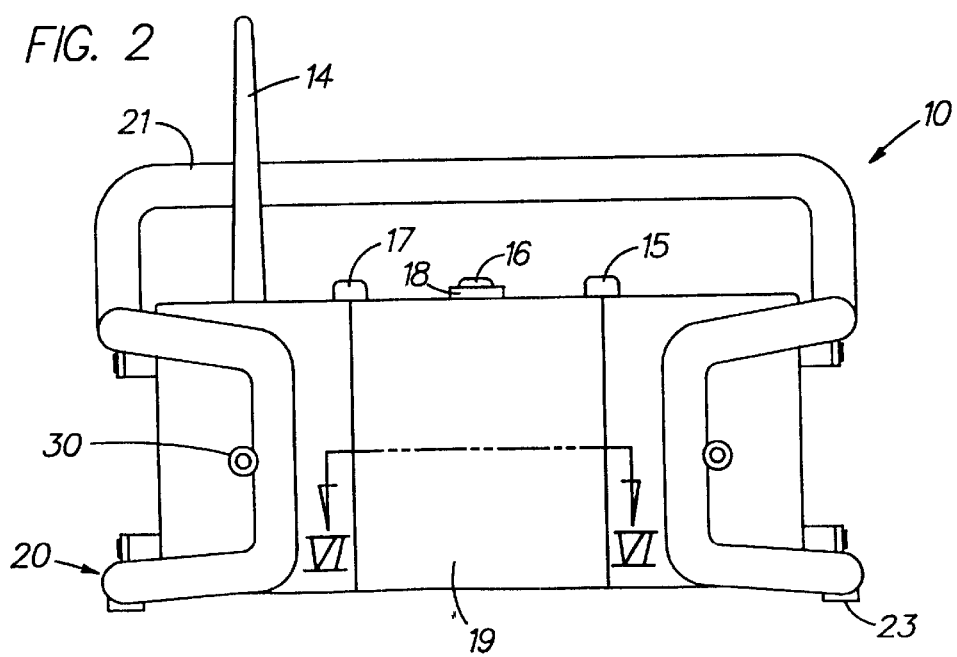
FIG. 2 is a rear elevational view of the audio equipment of FIG. 1.
Figure 3:
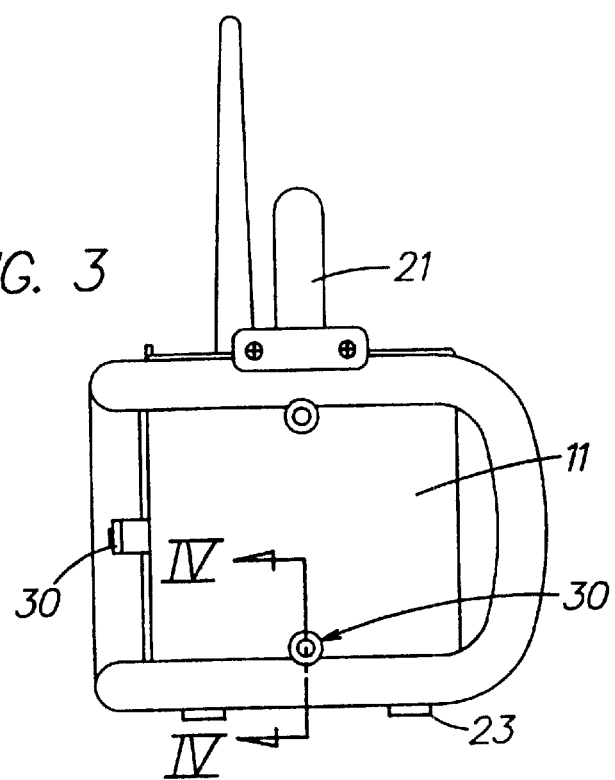
FIG. 3 is a side elevational view of the audio equipment of FIG. 1.

The invention is now described with reference to the accompanying figures, wherein like numerals designate like parts. Referring to FIGS. 1–3, an audio equipment component, such as radio 10, of the present invention comprises a housing 11. Housing 11 may support the radio circuitry (not shown), the speakers 12 connected to the radio circuitry, the volume, tuning and switch knobs (15, 16 and 17 respectively), antenna 14, and auxiliary input jack 13.

Preferably speakers 12 and part of housing 11 are coated with a waterproof coating, such as a rubber coating or paint. Alternatively, other waterproofing schemes may be used for protecting the speakers 12. For example, U.S. Pat. Nos. 3,391,754, 2,829,728, and 2,517,138 disclose appropriate waterproofing schemes and are hereby incorporated by reference.

The knobs may also comprise waterproofing means for impeding entry of water into housing 11. Such means may include walls created on the housing 11 and/or the knobs, creating a labyrinth passage for water. Alternatively, other waterproofing schemes may be used for the knobs. For example, U.S. Pat. Nos. 3,391,754, 3,277,739, 2,502,915 and 1,162,793 disclose appropriate waterproofing schemes and are hereby incorporated by reference.

Antenna 14 is preferably constructed of a flexible material, allowing antenna 14 to bend without breaking.

Preferably, at least one protective covering, shield, or shell is flexibly connected to the housing 11. An example of this protective covering is protective bar 20. Such covering or shield, e.g., bar 20, may be made of aluminum, or other suitable material. Preferably, covering or shield, e.g., bar 20 is made of a plastic, such as ABS or polypropylene. The covering or shield, e.g., bar 20, may be injection-molded. Alternatively, when the covering or shield is shaped as a bar, the plastic may be injected into a mold (preferably about half the volume needed to complete fill the mold and thus filling half of the mold), then air or gas is blown therein, pushing the plastic into the other half of the mold, forming a hollow tube. This process is known as gas-assist injection molding.

Preferably, the protective covering or shield is comprised of two bars 20 which are formed in respective loops and are connected to a respective side of housing 11. The protective covering or shield may also include a handle 21, which may be fixedly attached to the bars 20 via, e.g., screws (not shown). Preferably, the shape of bars 20 and/or handle 21 is such that the housing 11 cannot be contacted by anything wider than the handle 21 and/or bars 20. Such construction minimizes the risk of damage to housing 11, but still allows access to the working components of the radio and/or does not muffle the sound produced by the speakers.

Persons skilled in the art will recognize that the protective shield or bar 20 are preferably are releasably attached to the housing by coacting fasteners, such as screws, bolts, etc. By adapting protective shield or bar 20 in this manner, a user can replace parts of the protective shield or one bar 20 when damaged without incurring the expense of replacing entire shield, all bars 20 or radio 10.

Figure 4:
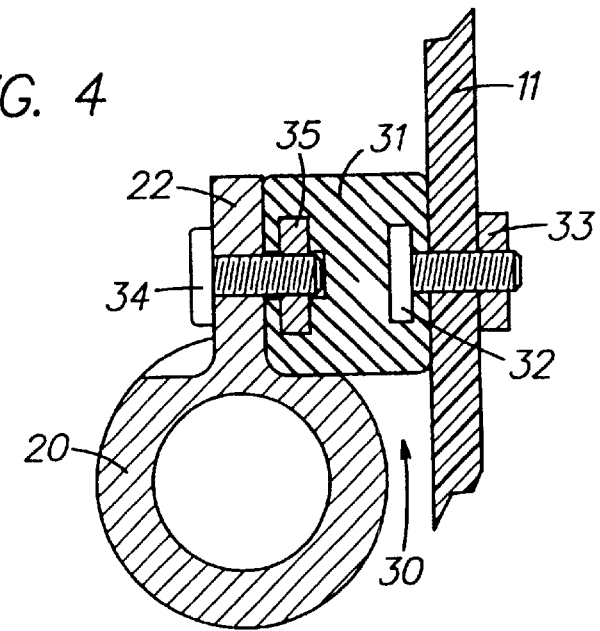
FIG. 4 is a cross-sectional view along line IV—IV of FIG. 3.

As mentioned above, the protective shield or bars 20 may be flexibly connected to the housing. Such connection is achieved via the connector assemblies 30. Referring to FIG. 4, a connector assembly 30 is disposed between the bar 20 and housing 11. The connector assembly 30 comprises a flexible gasket 31, which is preferably made of a flexible, resilient material such as rubber or an elastometer. The gasket 31 may be connected to the bar 20 via a screw 34 threadedly engaging a nut 35. The gasket 31 in turn may be connected to the housing 11 via a screw 32 threadedly engaging a nut 33. Gasket 31 may be molded over screw 32 and/or nut 35. Such construction minimizes the shock received by housing 11, and thus by the circuitry mounted within, when radio 10 is dropped.

Figure 6:
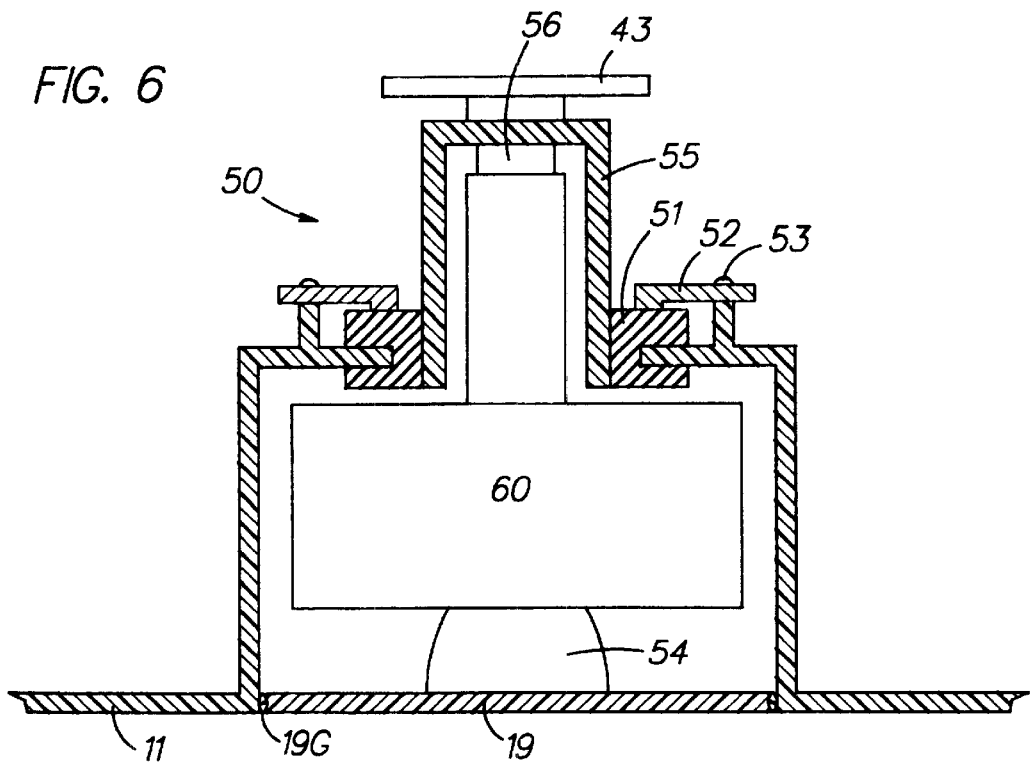
FIG. 6 is a cross-sectional view along line VI—VI of FIG. 2.

Referring to FIGS. 2 and 6, housing 11 may also have a door 19 pivotally attached thereto, providing access to receptacle assembly 50 and allowing an operator to install a battery pack 60 within housing 11. The door 19 may be kept in a closed position by latch 18. Preferably, latch 18 comprises an overcenter mechanism.

Door 19 may have a gasket 19G disposed thereon to limit the ingress of water into, if not wholly waterproof, receptacle assembly 15. Preferably gasket 19G is made of rubber or an elastomeric material. Persons skilled in the art will recognize that the gasket 19G may be disposed on housing 11 and perform the same function.

Preferably, receptacle assembly 50 is designed to receive a battery pack 60 via a connector 56. The connector 56 has a configuration appropriate to contact the battery terminals. Preferably the battery pack terminals and connector 56 will be arranged in the manner disclosed in U.S. Pat. No. 5,144,217, which is hereby incorporated in whole by reference.

The charger circuitry 43 may be fixedly connected to both connector 56 and receptacle assembly 50. Connector 56 preferably disposed on a floating receptacle housing 55, to minimize the shock received by the battery pack 60 and the circuitry 43 if the radio 10 is dropped. Charger circuitry 43 allows charging of battery packs having different voltages, as is well known in the art.

The receptacle housing 55 may be flexibly connected to the housing 11 via a flexible gasket 51. Preferably, gasket 51 is generally annular and made of a flexible, resilient material, such as rubber or elastometer.

Retainers 52 may be installed on housing 11 to prevent the disengagement of gasket 51 and housing 11 when pushing the battery pack 60 in place. Retainers 52 may be attached to housing 11 via screws 53 and may have a generally annular form. Retainers 52 may also prevent the removal of receptacle housing 55 when removing the battery pack 60 by providing a stopping surface which would contact the charger circuitry board 43.

A spring 54 may also be provided on door 19 to bias battery pack 60 into connection with connector 56. Preferably spring 54 will be flexible enough to bias battery packs having different sizes.

Figure 5:
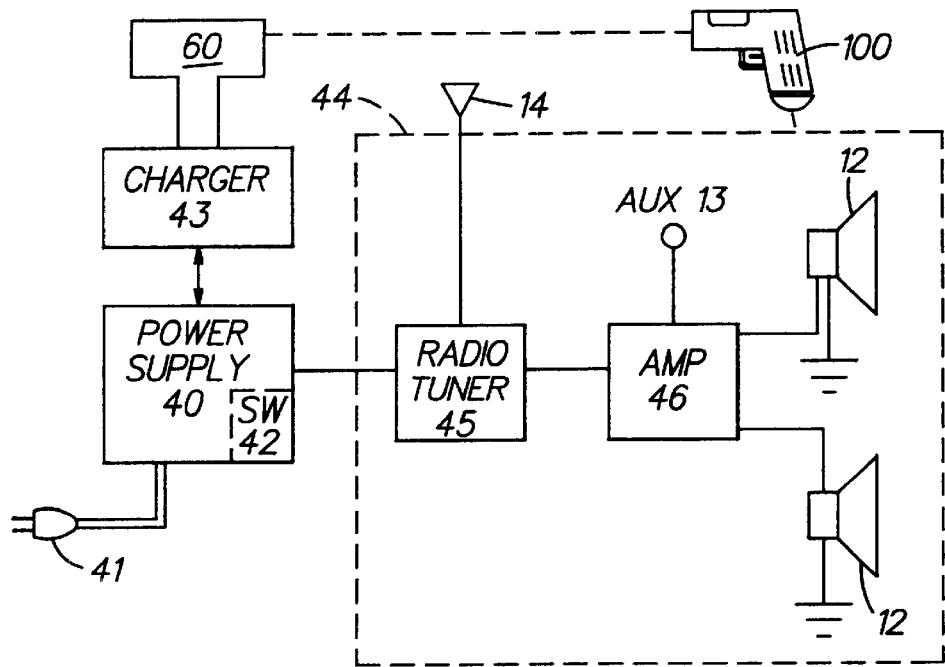
FIG. 5 is a block diagram of the circuitry of the audio equipment of FIG. 1.

FIG. 5 is a block diagram of the circuitry within housing 11. Charger circuitry 43 is connected to a power supply 40. Power supply 40 may receive power from an alternating current source via connector 41 and/or from charger 43 when a battery pack is being used as the power source for the radio 10. In addition, power supply 40 provides power to charger 43 in order to charge battery pack 60 even while the radio 10 is in operation.

Power supply 40 also provides power to radio circuitry 44. A switching means 42 may be connected to switch knob 17 to properly select the components receiving power. For example, the user can select if the power supply 40: (a) provides power to both the radio circuitry 44 and to charger 43 (for charging battery pack 60); (b) provides power to the radio circuitry 44 from the battery pack 60; (c) provides no power to any component; etc. Switching means 42 may comprise relays, transistors or other switching devices as is well known in the art. Preferably power supply 40 can accept power from battery packs having different voltages.

Radio circuitry 44 may comprise three main modules: (a) radio tuner 45 for receiving and demodulating the radio signal received via antenna 14; (b) amplifier 46 connected to tuner 45 for amplifying the demodulated radio signal; and (c) speakers 12 connected to amplifier 46 for converting the amplified signal into audible signals. Amplifier 46 may also amplify signals received from an auxiliary input 13, allowing a user to play a separate cassette deck or compact disk player through the radio 10.

Persons skilled in the art should recognize that the specific circuitry for each component is well known in the art. For example, radio circuitry 44 may include an FM Front End integrated circuit, such as the Sanyo LA1186N used in a well-known manner, in combination with a low frequency power amplifier integrated circuit, such as the Toshiba TA8227P used in a well-known manner. Persons skilled in the art are referred to the specifications of these two integrated circuits for further information on the standard usage, capabilites, parameters, etc.

Moreover, the radio circuitry 44 may be replaced with other circuitry for producing audio signals to the speakers via circuitry used with a cassette deck, compact disk or other methods to play music.

Preferably charger 43 is shielded with a metal covering, such as lead, copper, gold, etc., so as to not affect the reception, processing and/or amplification of the radio signal. Similarly, charger 43 can be provided with induction coils, or other types of filters, so as to minimize the effect of the charger on the radio signal, etc.

With such construction, for example, a user can charge a battery pack by disposing the battery pack 60 in the charger 43, providing power to the battery pack 60, and removing the battery pack 60 from the charger 43. The battery pack 60 can then be inserted into a power tool, such as drill 100 (FIG. 5). In other words, the user can listen to the radio 10 while charging the battery pack 60. Alternatively, the user can manually switch the power supply 40 so that the radio circuitry 43 receives the operating power from the battery pack 60, rather than from the alternating current source.

Persons skilled in the art may recognize other alternatives to the means disclosed herein. However, all these additions and/or alterations are considered to be equivalents of the present invention.

What is claimed is:

1. An apparatus comprising:
   a housing;
   a charger disposed within the housing;
   a receptacle in the charger;
   a battery pack, detachably connectable to a power tool, mounted in the receptacle;
   an audio circuit disposed within the housing for producing an audio signal comprising audio unrelated to the charger;
   a first electrical circuit for charging the battery pack and for powering the audio circuit; and
   a connector for connecting the first electrical circuit to a power source.

2. The apparatus of claim 1 wherein the connector is adapted for connection to an AC power source, and the apparatus further comprising a second electrical circuit connectable to the battery pack for powering the audio circuit when the connector is disconnected from an AC power source.

3. The apparatus of claim 1, wherein the audio circuit is a radio circuit.

4. An apparatus comprising:
   a housing;

a charger disposed within the housing for charging a power tool battery pack detachably connectable to a power tool;

an audio circuit disposed within the housing for producing an audio signal comprising audio unrelated to the charger;

a power supply circuit disposed within the housing for providing power to at least one of the charger and the audio circuit; and a connector for connecting the power supply circuit to a power source.

5. The apparatus of claim 4 wherein the connector is adapted for connection to an AC power source.

6. The apparatus of claim 4, further comprising an electrical circuit connectable to the battery pack for powering the audio circuit when the connector is disconnected from an AC power source.

7. The apparatus of claim 4, wherein the audio circuit is a radio circuit.

8. A method for charging a power tool battery pack comprising:

providing an audio equipment component having a housing, a power supply disposed within the housing, a charger disposed within the housing, an audio circuit disposed within the housing for producing an audio signal comprising audio unrelated to the charger, the audio circuit being connected to the power supply;

connecting the charger to the power supply;

connecting the battery pack to the charger;

providing power to the battery pack; and disconnecting the battery pack from the charger.

9. The method of claim 8, further comprising inserting the battery pack into a power tool.

10. The method of claim 8, further comprising providing power to the audio circuit while providing power to the battery pack.

11. The method of claim 8, further comprising manually switching the power supply to provide power to the audio circuit from the battery pack.

12. The method of claim 8, wherein the audio circuit is a radio circuit.

* * * * *

(12) EX PARTE REEXAMINATION CERTIFICATE (8150th)

United States Patent
Smith

(10) Number: US 6,496,688 C1
(45) Certificate Issued: Apr. 12, 2011

(54) HEAVY-DUTY AUDIO EQUIPMENT

(75) Inventor: Roger Q. Smith, Reisterstown, MD (US)

(73) Assignee: Black & Decker Inc., Newark, DE (US)

Reexamination Request:
No. 90/010,901, Mar. 10, 2010

Reexamination Certificate for:
Patent No.: 6,496,688
Issued: Dec. 17, 2002
Appl. No.: 10/140,449
Filed: May 6, 2002

Related U.S. Application Data

(63) Continuation of application No. 09/262,751, filed on Mar. 4, 1999, now Pat. No. 6,427,070.

(51) Int. Cl.
*H01M 2/10* (2006.01)
*H04B 1/08* (2006.01)

(52) U.S. Cl. .............. 455/343.6; 320/112; 320/113; 455/344; 455/347

(58) Field of Classification Search ............... None
See application file for complete search history.

(56) References Cited

U.S. PATENT DOCUMENTS

| | | | | |
|---|---|---|---|---|
| 3,458,794 | A | * | 7/1969 | Bohnstedt et al. ........... 320/111 |
| 4,739,242 | A | * | 4/1988 | McCarty et al. ............ 320/110 |
| 5,172,043 | A | * | 12/1992 | Toops ........................ 320/106 |
| 7,043,283 | B2 | * | 5/2006 | Domes .................... 455/575.1 |

OTHER PUBLICATIONS

"MANPACK: a new solution to an old problem", Apr. 1977, Signal Journal.*
Condensed Catalog "Receiving Equipment", Watkins–Johnson Company, 1982.*
Grundig SATELITT 700World Receiver Manual, 1996.*
Signal Journal Article, "MANPACK: A New Solution to an Old Problem" (the "Manpack Radio Article"), published Apr. 1977.
Watkins–Johnson Company Condensed Catalog "Receiving Equipment" (the "Watkins–Johnson Catalog"), published in 1982.
Grundig SATELLIT 700 World Receiver manual (the "Grundig Radio Manual"), published at least as early as 1996.

* cited by examiner

*Primary Examiner*—Pia Tibbits

(57) ABSTRACT

In accordance with the present invention, an improved audio equipment is employed. The audio equipment includes a housing, audio circuitry installed within the housing, and a first protective bar flexibly connected to the housing. The audio equipment may also include a handle attached to the first protective bar, a second protective bar flexibly connected to the housing, and/or a connector assembly flexibly connecting the first protective bar to the housing. The connector assembly may include a flexible gasket preferably disposed between the first protective bar and the housing. Also disclosed herein is a method for manufacturing an audio equipment.

At the time of issuance and publication of this certificate, the patent remains subject to pending reexamination control number 90/010,904 filed Mar. 10, 2010. The claim content of the patent may be subsequently revised if a reexamination certificate issues from the reexamination proceeding.

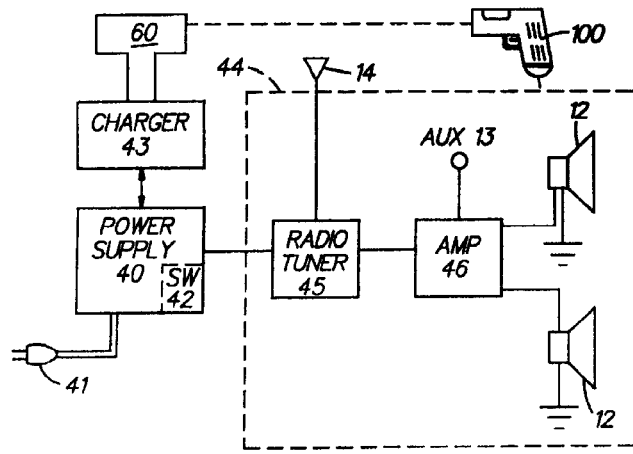

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–12 are cancelled.

* * * * *